(12) United States Patent
Marshall et al.

(10) Patent No.: US 6,262,461 B1
(45) Date of Patent: Jul. 17, 2001

(54) METHOD AND APPARATUS FOR CREATING A VOLTAGE THRESHOLD IN A FET

(75) Inventors: Daniel S. Marshall; William J. Ooms, both of Chandler; Jerald A. Hallmark, Gilbert; Yang Wang, Phoenix, all of AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/102,105

(22) Filed: Jun. 22, 1998

(51) Int. Cl.$^7$ .................................................. H01L 31/119
(52) U.S. Cl. ......................... 257/410; 257/295; 257/344
(58) Field of Search .................................. 257/295, 410, 257/411, 344

(56) References Cited

U.S. PATENT DOCUMENTS

| | | | |
|---|---|---|---|
| 5,436,490 | * 7/1995 | Nakamura | 257/410 |
| 5,686,151 | * 11/1997 | Imai et al. | 427/576 |
| 5,962,897 | * 10/1999 | Takemura et al. | 257/347 |
| 5,973,379 | * 10/1999 | Ooms et al. | 257/410 |
| 5,986,301 | * 11/1999 | Fukushima et al. | 257/306 |

\* cited by examiner

*Primary Examiner*—Sara Crane
(74) *Attorney, Agent, or Firm*—Eugene A. Parsons

(57) ABSTRACT

A method of fabricating a field effect transistor including doping a continuous blanket layer in a semiconductor substrate structure adjacent the surface to include a source area and a drain area spaced from the source area. A high dielectric constant insulator layer is positioned on the surface of the semiconductor substrate structure overlying the continuous blanket layer to define a gate area between the source and drain areas. A gate contact on the insulator layer is selected to provide a work function difference that depletes the doped layer beneath the insulator layer. Further, the doped layer depth and dosage are designed such that the doped layer is depleted beneath the insulator layer by the selected work function difference of the gate contact and the semiconductor substrate.

14 Claims, 1 Drawing Sheet

METHOD AND APPARATUS FOR CREATING A VOLTAGE THRESHOLD IN A FET

FIELD OF THE INVENTION

The present invention pertains to field effect transistors and more particularly to very high dielectric constant gate field effect transistors.

BACKGROUND OF THE INVENTION

The pressure to continually scale down the size of semiconductors requires that thinner and thinner gates be used. The standard dielectric layer, $SiO_2$, for semiconductor field effect transistor (FET) gates is becoming too thin to prevent excessive tunneling current. Higher dielectric constant (K) materials, such as $Si_3N_4$ (K=7) and $Ta_2O_5$ (K=20), are being investigated for some electrical applications. For example, high K materials have been used to form electrical components such as non-volatile memories, capacitors, and optical guided wave devices.

A FET consists of a gate insulator disposed over a semiconductor substrate, with a small amount of dopant placed into its surface using a threshold implant, and gate metal disposed over the gate insulator. The gate metal and the gate insulator are etched to form a gate structure and a self-aligned source/drain implant is used to form the source and drain of the device. By applying a potential to the gate metal, the gate insulator transmits charge to the semiconductor substrate and the semiconductor substrate is induced to become an n or p-type conductor under the gate insulator. This in turn makes the device laterally conductive or insulating, depending on the channel type of the semiconductor substrate and the threshold voltage of the FET, which is determined by the threshold implant under the gate insulator. A drawback in the manufacture of these devices is that the threshold implant takes time and must be controlled to a precise level. Another drawback in the manufacture of these devices is the need to implant the source and drain using a self-aligned implant on either side of the gate structure. These drawbacks result in higher production costs.

Accordingly, it would be advantageous if the need for the threshold implant were eliminated and if the threshold voltage of the FET were determined essentially by material parameters.

It is a purpose of the present invention to provide a new and improved FET and method of manufacture.

It is another purpose of the present invention to provide a new and improved FET in which gate leakage current and device capacitance are reduced.

It is a further purpose of the present invention to provide a new and improved FET in which the threshold voltage of the FET are determined essentially by material parameters.

It is a still further purpose of the present invention to provide a new and improved FET and method of manufacture in which the need for a threshold implant is eliminated.

It is another purpose of the present invention to provide a new and improved FET and method of manufacture in which the need for self-aligned source/drain implants is eliminated.

It is still another purpose of the present invention to provide a new and improved enhancement mode FET and method of manufacture using a depletion mode-type constant implant between and including the source and the drain.

SUMMARY OF THE INVENTION

The above problems and others are at least partially solved and the above purposes and others are realized in a method of fabricating a field effect transistor including doping a continuous blanket layer in a semiconductor substrate structure adjacent the surface to include a source area and a drain area spaced from the source area. A high dielectric constant insulator layer is positioned on the surface of the semiconductor substrate structure overlying the continuous blanket layer to define a gate area between the source and drain areas. Preferably the dielectric constant of the insulator layer is at least 25. A gate contact on the insulator layer is selected to provide a work function difference that depletes the doped layer beneath the insulator layer. Further, the doped layer depth and dosage are designed such that the doped layer is depleted beneath the insulator layer by the selected work function difference of the gate contact and the semiconductor substrate.

BRIEF DESCRIPTION OF THE DRAWINGS

Referring to the drawings.

DESCRIPTION OF THE PREFERRED EMBODIMENTS

Figure 1:
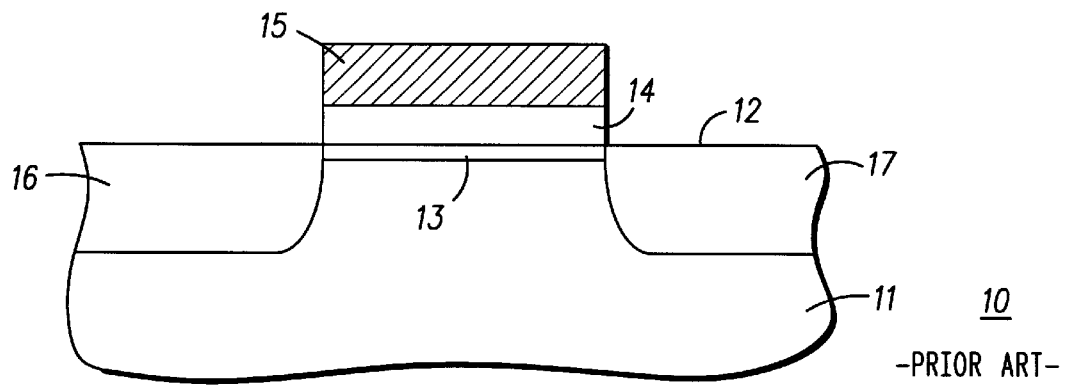
FIG. 1 is a simplified sectional view of a prior art FET.

Turning now to the drawings and specifically FIG. 1, a simplified sectional view of a prior art field effect transistor (FET) 10 is illustrated. FET 10 is formed on a semiconductor substrate 11 having an upper surface 12. In the fabrication of FET 10 it is common to implant a small amount of dopant, represented by layer 13, adjacent surface 12 using a threshold implant. A gate insulator 14 is positioned on surface 12 and gate metal 15 is formed on insulator 14. The voltage threshold ($V_T$) of a traditional MOS device, such as FET 10, depends on many factors including substrate doping (e.g. layer 13), the gate insulator and metal materials (insulator 14), and the work function of the gate materials. In most cases, silicon oxide is used as the gate insulator and dominates the system with most of the work function difference from gate to substrate dropping across the oxide. Layer 13 of threshold implant is designed, in conjunction with the voltage threshold ($V_T$) of FET 10, to provide a depletion area for the operation of FET 10. In a typical prior art FET, the voltage threshold ($V_T$) is influenced as much by the threshold implant (layer 13) as by the work function difference between the gate and the substrate.

Gate metal 15 and the gate insulator 14 are etched to form a gate structure and a self-aligned source/drain implant is used to form the source and drain 16 and 17, respectively, of the device. By applying a potential to gate metal 15, gate insulator 14 transmits charge to semiconductor substrate 11 and the semiconductor substrate is induced to become an n or p-type conductor under gate insulator 14. This in turn makes FET 10 laterally conductive or insulating, depending on the channel type of semiconductor substrate 11 and the threshold voltage of FET 10, which is substantially influenced by threshold implant 13 under gate insulator 14. A drawback in the manufacture of FET 10 is that threshold implant 13 takes extra process steps, labor, and time and must be controlled to a precise level. Another drawback in the manufacture of FET 10 is the need to implant source 16 and drain 17 using a self-aligned implant on either side of the gate structure. These drawbacks result in higher production costs.

Figure 2:
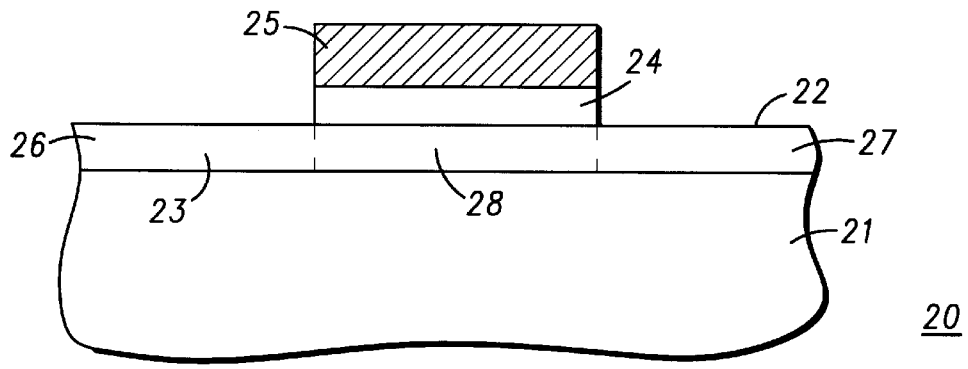
FIG. 2 is a simplified sectional view of a FET in accordance with the present invention.

Referring now to FIG. 2, a simplified sectional view is illustrated of a FET 20, in accordance with the present invention. In a method of fabricating FET 20, a semiconductor substrate structure 21 is provided with a surface 22. For convenience in the explanation of the present invention, substrate structure 21 is illustrated as including only a supporting substrate, however, it should be understood that substrate structure 21 may include a supporting substrate alone or in conjunction with one or more layers of material formed thereon. A relatively heavily doped, continuous blanket layer 23 is formed in substrate 21 adjacent surface 22 by any convenient doping method, such as implanting, diffusion, or the like. Blanket layer 23 includes a source area 26 and a drain area 27, as well as the area between source area 26 and drain area 27. In the event that a plurality of MOS devices are being fabricated simultaneously on substrate 21, blanket layer 23 will cover the entire surface 22 of substrate 21, except in areas designated as isolation areas between FETs.

A high dielectric constant insulator layer 24 is positioned on surface 22 of semiconductor substrate structure 21 in overlying relationship to blanket layer 23 and a gate contact 25 is positioned on Insulator layer 24 to complete the gate structure. The gate structure is formed by some convenient patterning technique, such as pattern and etch steps, lift-off, etc. Insulator layer 24 defines a gate area 28 in semiconductor substrate 21 (and blanket layer 23) between the source and drain areas 26 and 27.

Generally, it is preferred that insulator layer 24 has a dielectric constant (K) of at least 25. It is also generally preferred that gate contact 25 consist of a conductive material with a work function approximately in the middle of the semiconductor energy gap, $E_g$, ($\phi_m = \chi_{sc} + E_g/2$). In a preferred embodiment, substrate structure 21 is formed of silicon and insulator layer 24 consisting of (CaSr)TiO$_3$ is epitaxially grown on surface 22. In this preferred embodiment, a layer of molybdenum silicide is then formed on high dielectric constant insulator layer 24 as gate contact 25, however, it should be understood that different materials may be used for gate contact 25, such as a layer of conductive oxide (e.g. iridium oxide) or a layer of perovskite oxide (e.g. SrRuO$_3$). The molybdenum silicide gate contact 25 has a work function approximately in the middle of the energy gap of silicon and combined with the (CaSr)TiO$_3$ insulator layer 24, allows the threshold to be set at approximately 0.55 volts for both n-channel and p-channel devices, resulting in excellent 1 V technology. Also, by providing an insulator layer that has a dielectric constant (K) of at least 25, the thickness of insulator layer 24 can be increased to reduce leakage current. Generally, the higher the dielectric constant, the thicker insulator layer 24 can be formed. In a rough approximation, if an insulator layer with a dielectric constant of 50 is provided, the layer can be twice as thick as an insulator layer with a dielectric constant of 25, and the leakage current will be reduced exponentially.

Here it should be understood that by using empirical methods, blanket layer 23 is doped with a depth and dosage such that doped layer 23 is depleted and defines gate area 28 beneath insulator layer 24 primarily by the work function difference of gate contact 25 and semiconductor substrate structure 21. In fact, by selecting insulator layer 24 with a sufficiently high dielectric constant, gate contact 25 appears (electrically) to be positioned directly on surface 22 of substrate structure 21 similar to the gate of a MESFET. However, because insulator layer 24 is positioned between substrate structure 21 and gate contact 24, the device operates like a MOSFET with the very low leakage current.

The materials of gate contact 25 and semiconductor substrate structure 21 are first chosen to provide the desired work function difference, and blanket layer 23 is doped with a depth and dosage such that doped layer 23 is depleted and defines gate area 28 beneath insulator layer 24 by the selected work function difference. Thus, the underlying channel, gate area 28, becomes depleted by the work function difference, leaving source and drain areas 26 and 27 with doping like that of a self-aligned source/drain implant without actually performing a self-aligned implant and the high temperatures placed on the structure necessary for activation of the implant. As will be recognized by those skilled in the art, in most instances the gate metal cannot be deposited until after the implants and activation have occurred. In the present method and structure the activation occurs after doping layer 23 and before the gate terminal is started.

Figure 3:
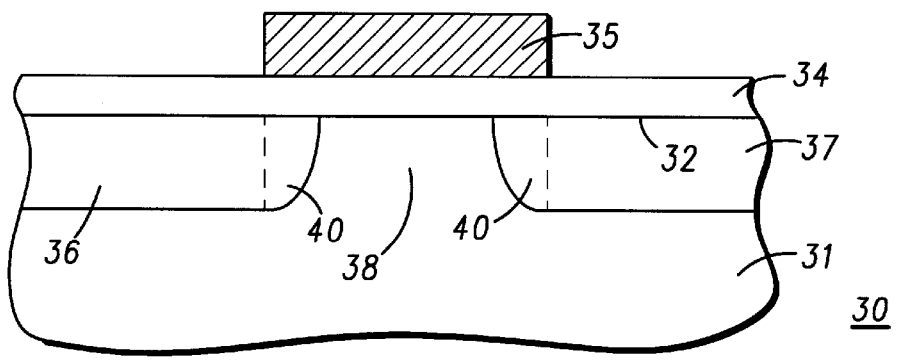
FIG. 3 is a simplified sectional view of another embodiment of a FET in accordance with the present invention.

Referring to FIG. 3, another embodiment is illustrated of a FET 30 in accordance with the present invention. In a method of fabricating FET 30, a semiconductor substrate structure 31 is provided with a surface 32. For convenience in the explanation of the present invention, substrate structure 31 is illustrated as including only a supporting substrate, however, it should be understood that substrate structure 31 may include a supporting substrate alone or in conjunction with one or more layers of material formed thereon. Relatively heavily doped, spaced apart source area 36 and drain area 37 are formed in substrate 31 adjacent surface 32 by any convenient doping method, such as implanting, diffusion, or the like. Source area 36 and drain area 37 define a gate area 38 therebetween. Here it should be noted that source and drain areas 36 and 37 are formed by any standard masking technique and are not self-aligned so that the high activation temperatures will not affect the various terminals and other structures.

A blanket insulator layer 34 of high dielectric constant dielectric material is formed on surface 32 of substrate structure 31 by any convenient technique, such as epitaxial growth or the like, and a gate contact 35 is positioned generally over gate area 38 to complete the gate structure. The gate structure is formed by some convenient patterning technique, such as pattern and etch steps, lift-off, etc. As is common in such procedures, gate contact 35 covers small portions 40 of source and drain areas 36 and 37. In traditional low K gate devices (e.g. SiO$_2$) portions 40, where gate contact 35 overlies heavily doped source and drain areas 36 and 37, produce a high capacitance in FET 30 which will adversely affect the operating characteristics. In the present embodiment, the materials of gate contact 35 and semiconductor substrate structure 31 are first chosen to provide the desired work function difference, and insulator layer 34 has a sufficiently high dielectric constant so that portions 40 are depleted beneath gate contact 35 by the selected work function difference. Thus, the entire underlying channel, including gate area 38 and portions 40, become depleted by the work function difference, and the overlap capacitance of FET 30 is substantially reduced.

Thus a new and improved FET and method of manufacture are disclosed in which gate leakage current and device capacitance are reduced. Gate leakage current is reduced because the high dielectric constant insulator material can be made thicker than materials such as oxides and nitrides while still achieving the desired result. In the improved FET of the present invention the threshold voltage of the FET is determined essentially by material parameters. Further, the improved FET of the present invention is less expensive and easier to manufacture because the need for a threshold implant is eliminated and any implant used are performed early in the process. Also, the present method of manufacture eliminates the need for self-aligned source/drain implants.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A field effect transistor comprising:

a semiconductor substrate structure with a surface;

a continuous doped layer in the semiconductor substrate adjacent the surface;

a substantially non-ferroelectric high dielectric constant insulator layer positioned on the surface of the semiconductor substrate overlying the doped layer; and a gate contact positioned on the insulator layer, the semiconductor substrate and the gate contact providing a work function difference that, in conjunction with the high dielectric constant insulator layer, depletes an adjacent portion of the continuous doped layer forming a gate area that creates a source area and a drain area of the continuous doped layer on opposite sides of the gate area.

2. A field effect transistor as claimed in claim 1 wherein the high dielectric constant insulator layer has a dielectric constant of at least 25.

3. A field effect transistor as claimed in claim 1 wherein the doped layer has a depth and dosage such that the doped layer is depleted beneath the insulator layer by a work function difference of the gate contact and the semiconductor substrate.

4. A field effect transistor as claimed in claim 1 wherein the semiconductor substrate is formed of silicon.

5. A field effect transistor as claimed in claim 4 wherein the high dielectric constant insulator layer is formed of $(CaSr)TiO_3$.

6. A field effect transistor as claimed in claim 5 wherein the gate contact includes molybdenum silicide.

7. A field effect transistor as claimed in claim 1 wherein the gate contact includes a conductive oxide.

8. A field effect transistor as claimed in claim 1 wherein the gate contact includes a conductive perovskite.

9. A low overlap capacitance field effect transistor comprising:

a semiconductor substrate structure with a surface;

a source area and a drain area spaced from the source area doped in the semiconductor substrate structure adjacent the surface, and defining a non-doped area therebetween;

a substantially non-ferroelectric high dielectric constant insulator layer positioned on the surface of the semiconductor substrate structure generally overlying the non-doped area and portions of the source and drain areas;

a gate contact positioned on the insulator layer; and the materials for the semiconductor substrate structure and the gate contact providing a work function difference therebetween that, in conjunction with the high dielectric constant insulator layer, depletes a gate area including the non-doped area and at least some of the portions of the source and drain areas beneath the high dielectric constant insulator layer.

10. A field effect transistor as claimed in claim 9 wherein the semiconductor substrate is formed of silicon.

11. A field effect transistor as claimed in claim 10 wherein the high dielectric constant insulator layer is formed of $(CaSr)TiO_3$.

12. A field effect transistor as claimed in claim 11 wherein the gate contact includes molybdenum silicide.

13. A field effect transistor as claimed in claim 9 wherein the gate contact includes a conductive oxide.

14. A field effect transistor as claimed in claim 9 wherein the gate contact includes a conductive perovskite.

* * * * *